(12) United States Patent
Tian et al.

(10) Patent No.: US 12,105,134 B2
(45) Date of Patent: Oct. 1, 2024

(54) METHOD AND SYSTEM FOR QUICKLY DETERMINING TRANSIENT STABILITY OF HALF-WAVELENGTH TRANSMISSION SYSTEM

(71) Applicant: State Grid Shandong Electric Power Research Institute, Shandong (CN)

(72) Inventors: Hao Tian, Shandong (CN); Dong Yang, Shandong (CN); Zhe Jiang, Shandong (CN); Kang Zhao, Shandong (CN); Huan Ma, Shandong (CN); Ning Zhou, Shandong (CN); Zhixuan Zhang, Shandong (CN); Dingyi Cheng, Shandong (CN); Shan Li, Shandong (CN); Wenxue Liu, Shandong (CN); Qiao Fang, Shandong (CN); Xudong Hao, Shandong (CN); Facai Xing, Shandong (CN)

(73) Assignee: State Grid Shandong Electric Power Research Institute, Jinan (CN)

( * ) Notice: Subject to any disclaimer, the term of this patent is extended or adjusted under 35 U.S.C. 154(b) by 0 days.

(21) Appl. No.: 17/925,850

(22) PCT Filed: Aug. 4, 2022

(86) PCT No.: PCT/CN2022/110130
§ 371 (c)(1),
(2) Date: Nov. 17, 2022

(87) PCT Pub. No.: WO2023/077889
PCT Pub. Date: May 11, 2023

(65) Prior Publication Data
US 2024/0230743 A1    Jul. 11, 2024

(30) Foreign Application Priority Data
Nov. 4, 2021 (CN) .......................... 202111300840.6

(51) Int. Cl.
*G01R 31/08* (2020.01)
*H02J 3/00* (2006.01)

(52) U.S. Cl.
CPC ......... *G01R 31/088* (2013.01); *G01R 31/085* (2013.01); *H02J 3/00125* (2020.01)

(58) Field of Classification Search
None
See application file for complete search history.

(56) References Cited

U.S. PATENT DOCUMENTS 6,668,137 B1 * 12/2003 Cordina .............. H04J 14/0221
398/94

OTHER PUBLICATIONS

Hao Tian, Studies on Operation Characteristics and Voltage Control of UHV Half-Wavelength Transmission System, A Dissertation submitted for the Doctoral Degree of Philosophy in Power System and its Automation at Shandong University, May 28, 2020.

* cited by examiner

Primary Examiner — Farhana A Hoque

(57) ABSTRACT

The present disclosure provides a method and a system for quickly determining transient stability of a half-wavelength transmission system. The method includes: obtaining power and a power angle of a feeding-end generator of a half-wavelength transmission system; and determining transient power angle stability and a power angle instability mode of the half-wavelength transmission system by using a constructed index system, where two power angle instability modes, that is, an instability mode 1 and an instability mode 2, are specifically constructed for the half-wavelength transmission system based on an equal area method. Based on the equal area method, the present disclosure constructs two instability modes specific to the half-wavelength transmission system, so as to accurately describe transient power angle characteristics of the half-wavelength transmission (Continued)

system under a severe fault, and characteristics of the two instability modes are significantly different from those of an AC transmission mode.

14 Claims, 5 Drawing Sheets

METHOD AND SYSTEM FOR QUICKLY DETERMINING TRANSIENT STABILITY OF HALF-WAVELENGTH TRANSMISSION SYSTEM

TECHNICAL FIELD

The present disclosure relates to the technical field of analysis on transient power angle stability of a power system, and in particular, to a method and a system for quickly determining transient stability of a half-wavelength transmission system.

BACKGROUND

This section is merely intended to provide background information related to the present disclosure, and does not necessarily constitute the prior art.

A half-wavelength alternating current (AC) transmission technology is an ultra-distance three-phase AC transmission technology with an electrical distance of nearly a half wavelength at the power frequency, namely, about 3000 km at 50 Hz, during transmission. A half-wavelength transmission line does not emit or absorb reactive power, a corresponding transmission system structure therefor is simpler than that in a traditional ultra-high voltage (UHV) AC transmission mode, and no additional voltage support equipment needs to be provided along the line; and complex conversion and harmonic pollution that exist in a UHV direct current (DC) transmission mode are avoided, which makes equipment construction and maintenance more convenient. Therefore, the half-wavelength transmission technology has a certain research prospect and can play a certain role in the future power grid construction.

The half-wavelength transmission line has a most severe fault zone. When a short circuit fault occurs near this zone, overvoltage occurs along the line and electromagnetic power of a generator is significantly increased. An imbalance between the electromagnetic power and mechanical power increases a risk of transient instability of a system. Usually, the half-wavelength transmission line is slightly longer than a distance of the half wavelength at the power frequency. Under a normal operating condition, electrical angles of feeding and receiving ends are about 180°. In an existing synchronous power grid, in engineering, a determining basis of whether the system is stable is whether a maximum power angle difference of the generator is greater than a certain value, and the value is usually 180° to 360°, depending on different documents. Obviously, the engineering practicability determining basis is not applicable to a half-wavelength transmission system with a power angle exceeding 180° under the normal operating condition, and a more general stability determining method is required.

With a development of a phasor measurement unit (PMU) and a wide area measurement system (WAMS), it is possible to obtain trajectory information of the generator in real time. Real-time trajectory information of the generator directly reflects a degree of transient stability of a power system, and real-time transient stability can be analyzed and controlled based on measured trajectory information, without depending on a model and parameters.

SUMMARY

In order to resolve the above problems, the present disclosure provides a method and a system for quickly determining transient stability of a half-wavelength transmission system. The present disclosure can quickly determine power angle stability of a half-wavelength transmission system based on trajectory information of a generator and classify instability modes.

According to some embodiments, the present disclosure adopts the following technical solutions.

A method for quickly determining transient stability of a half-wavelength transmission system includes:
  obtaining power and a power angle of a feeding-end generator of a half-wavelength transmission system; and
  determining transient power angle stability and a power angle instability mode of the half-wavelength transmission system by using a constructed index system, where two power angle instability modes, that is, an instability mode 1 and an instability mode 2, are specifically constructed for the half-wavelength transmission system based on an equal area method.

Further, in the instability mode 1, the generator continuously decelerates and loses stability; and in the instability mode 2, the generator decelerates first, and then continuously accelerates and loses the stability.

Further, the constructed index system includes a phase plane curve between the power angle and an angular velocity of the generator, which takes the power angle of the generator as an abscissa and an angular velocity of the generator as an ordinate.

Further, the constructed index system further includes boundaries of a convex region, and the boundaries of the convex region are constructed based on convexity-concavity, of a phase trajectory, defined by a change rate of which a slope of the phase trajectory of the phase plane curve between the power angle and the angular velocity of the generator changes with the power angle.

Further, the instability mode 1 is defined as that the phase trajectory of the generator moves to a left plane and crosses a left boundary of the convex region.

Further, the instability mode 2 is defined as that the phase trajectory of the generator first moves to the left plane, and then moves to a right plane and crosses a right boundary of the convex region.

Further, the constructed index system further includes an auxiliary index for representing a direction field of an inflection point; and
  the determining transient power angle stability and a power angle instability mode of the half-wavelength transmission system by using a constructed index system includes:
  constructing a method for discretizing a determining index, to meet needs of engineering stability; and
  discretizing the constructed index system by using the constructed method for discretizing the determining index, to determine the transient power angle stability and the power angle instability mode of the half-wavelength transmission system based on a discretized index system.

A system for quickly determining transient stability of a half-wavelength transmission system includes:
  a data obtaining unit configured to obtain power and a power angle of a feeding-end generator of a feeding half-wavelength transmission system; and
  a mode determining unit configured to determine transient power angle stability and a power angle instability mode of the half-wavelength transmission system by using a constructed index system, where
  two power angle instability modes, that is, an instability mode 1 and an instability mode 2, are specifically constructed for the half-wavelength transmission system based on an equal area method.

A computer-readable storage medium stores a plurality of instructions, where the instructions are suitable for being loaded by a processor of a terminal device to execute the method for quickly determining transient stability of a half-wavelength transmission system.

A terminal device includes a processor and a computer-readable storage medium, where the processor is configured to implement various instruction; and the computer-readable storage medium is configured to store a plurality of instructions, and the instructions are suitable for being loaded by the processor to execute the method for quickly determining transient stability of a half-wavelength transmission system.

Compared with the prior art, the present disclosure has the following beneficial effects.

Based on the equal area method, the present disclosure constructs two instability modes specific to the half-wavelength transmission system, so as to accurately describe transient power angle characteristics of the half-wavelength transmission system under a severe fault, and characteristics of the two instability modes are significantly different from those of an AC transmission mode.

The present disclosure constructs a transient stability determining method based on a trajectory curve of the feeding-end generator of the half-wavelength transmission system. The convexity-concavity of the phase trajectory is defined based on the change rate of which the slope of the phase trajectory of the generator changes with the power angle, and the boundaries of the convex region are constructed. Different instability modes are classified based on a direction and an angle of which the phase trajectory of the generator enters the boundary of the convex region, which ensures accuracy and operability of determining of the transient stability.

The present disclosure constructs the method for discretizing the determining index, and proposes the auxiliary index for representing the direction field of the inflection point. The method for discretizing the determining index is constructed to adapt to discrete engineering data. In addition, the auxiliary index for representing the direction field of the inflection point is constructed. In this way, impact of a data error, an excitation regulator, a frequency regulator, and other factors is avoided, which makes the determining of the transient stability more robust.

BRIEF DESCRIPTION OF THE DRAWINGS

The accompany drawings of the specification constituting a part of the present disclosure provide further understanding of the present disclosure. The schematic embodiments of the present disclosure and description thereof are intended to be illustrative of the present disclosure and do not constitute an undue limitation of the present disclosure.

DETAILED DESCRIPTION

The present disclosure is described in further detail below with reference to the accompanying drawings and embodiments.

It should be noted that the following detailed descriptions are exemplary and are intended to provide further descriptions of the present disclosure. Unless otherwise defined, all technical and scientific terms used herein have the same meaning as commonly understood by one of ordinary skilled in the art to which the present disclosure pertains.

It should be noted that the terms used herein are merely used for describing the specific implementations, but are not intended to limit exemplary implementations of the present disclosure. As used herein, the singular forms are intended to include the plural forms as well, unless the context clearly indicates otherwise, and also, it should be understood that when the terms "include" and/or "comprise" are used in this specification, they indicate that there are features, steps, operations, devices, components, and/or combinations thereof.

Embodiment 1

Figure 1:
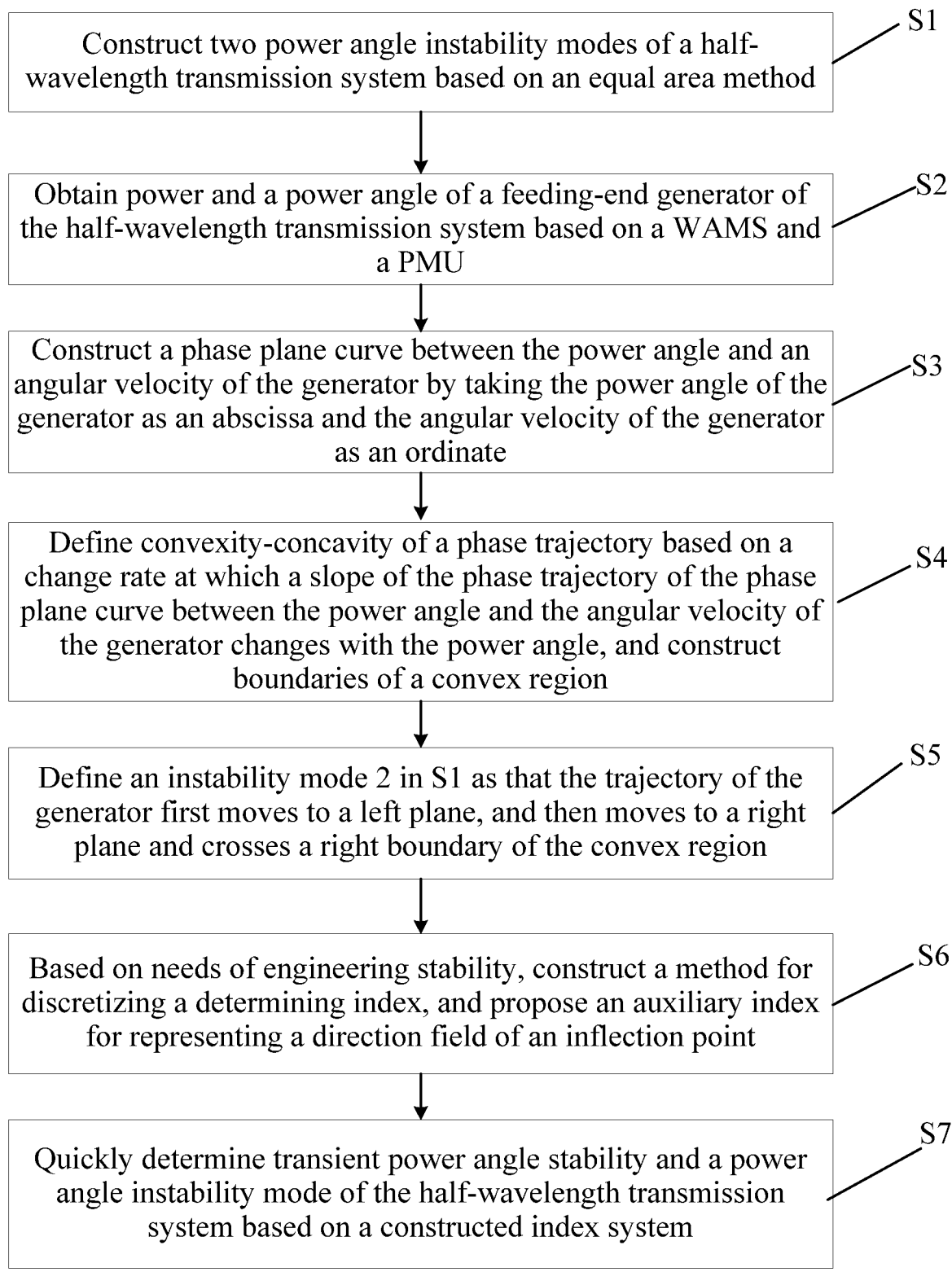
FIG. 1 is a flowchart according to an embodiment.

As shown in FIG. 1, a method for quickly determining transient stability of a half-wavelength transmission system includes the following steps:

S1: Construct two power angle instability modes of a half-wavelength transmission system based on an equal area method: an instability mode 1 in which a generator continuously decelerates and loses stability, and an instability mode 2 in which the generator decelerates first, and then continuously accelerates and loses stability.

S2: Obtain power and a power angle of a feeding-end generator of the half-wavelength transmission system based on a WAMS and a PMU, where the power of the generator includes mechanical power and electromagnetic power.

S3: Construct a phase plane curve between the power angle and an angular velocity of the generator by taking the power angle of the generator as an abscissa and the angular velocity of the generator as an ordinate.

S4: Define convexity-concavity of a phase trajectory based on a change rate of which a slope of the phase trajectory of the phase plane curve between the power angle and the angular velocity of the generator changes with the power angle, and construct boundaries of a convex region.

S5: Define the instability mode 1 in S1 as that the phase trajectory of the generator moves to a left plane and crosses a left boundary of the convex region, and define the instability mode 2 in S1 as that the phase trajectory of the generator first moves to the left plane, and then moves to a right plane and crosses a right boundary of the convex region.

S6: Based on needs of engineering stability, construct a method for discretizing a determining index, and propose an auxiliary index for representing a direction field of an inflection point.

S7: Quickly determine transient power angle stability and a power angle instability mode of the half-wavelength transmission system based on a constructed index system.

Specifically,

S1: Construct the two power angle instability modes of the half-wavelength transmission system based on the equal area method.

If a damping is ignored, a motion equation of a rotor of a feeding-end equivalent generator can be expressed as:

$$\begin{cases} \dfrac{d\delta}{dt} = \omega_0 \Delta\omega \\ \dfrac{T_J}{\omega_0} \dfrac{d\Delta\omega}{dt} = P_m - P_e(\delta) \end{cases}$$

In the above equation, $\omega_0$ represents a synchronous angular velocity in an initial state; $\Delta\omega$ represents a change value of the angular velocity; $T_J$ represents an inertia time constant; $P_m$ and $P_e(\delta)$ represent the mechanical power and the electromagnetic power respectively; $\delta$ represents the power angle of the generator; and t represents time.

Effects of a governor of the generator and the damping are ignored, and the mechanical power $P_m=P_e(\delta_0)$ remains unchanged. It is assumed that a three-phase short circuit occurs at time t=0, and fault clearing time is $t_c$. After the fault is cleared, it is assumed that a system structure and a load state are the same as those before the fault.

Figure 2A:
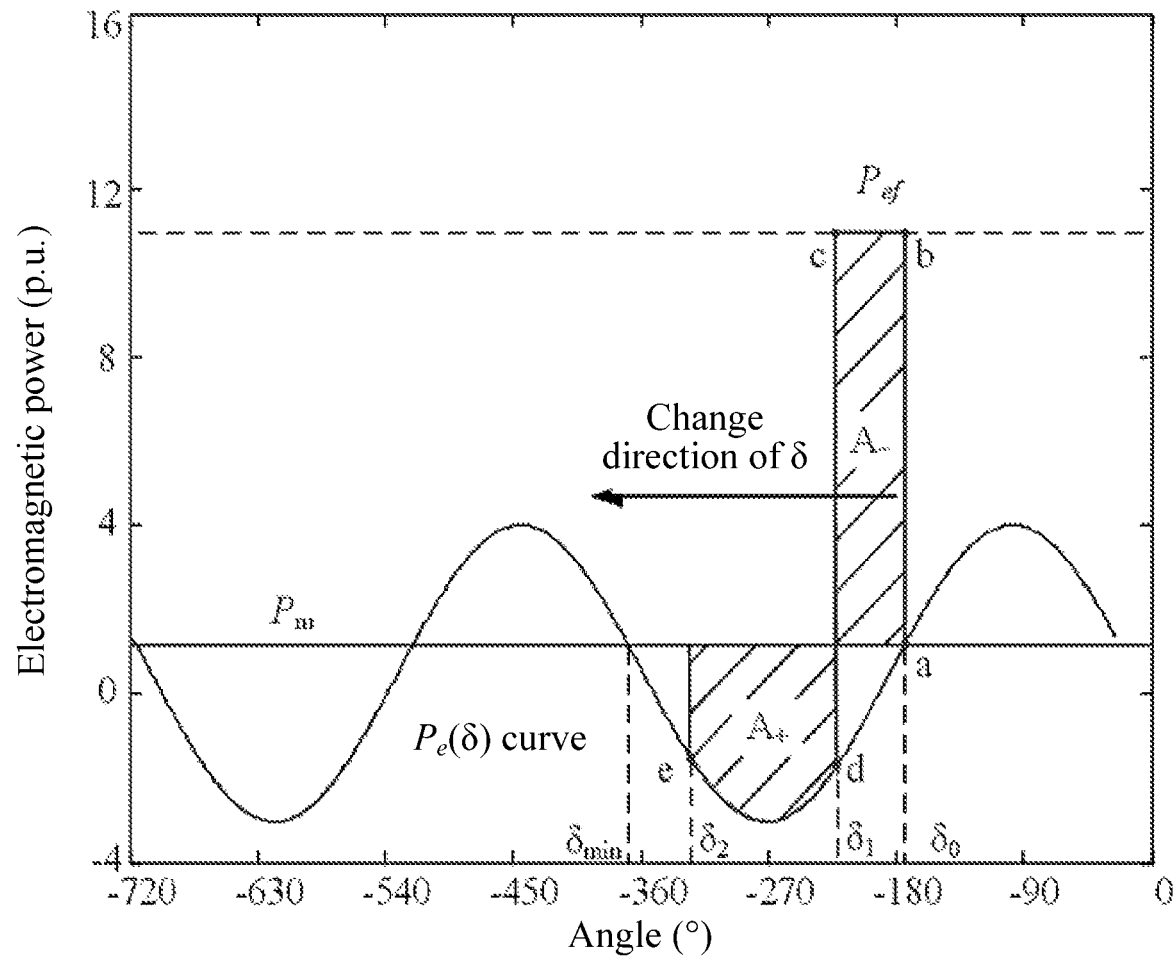
FIG. 2(a) is a diagram of a phase-1 power angle operating state of a half-wavelength transmission system according to an embodiment.
Figure 2B:
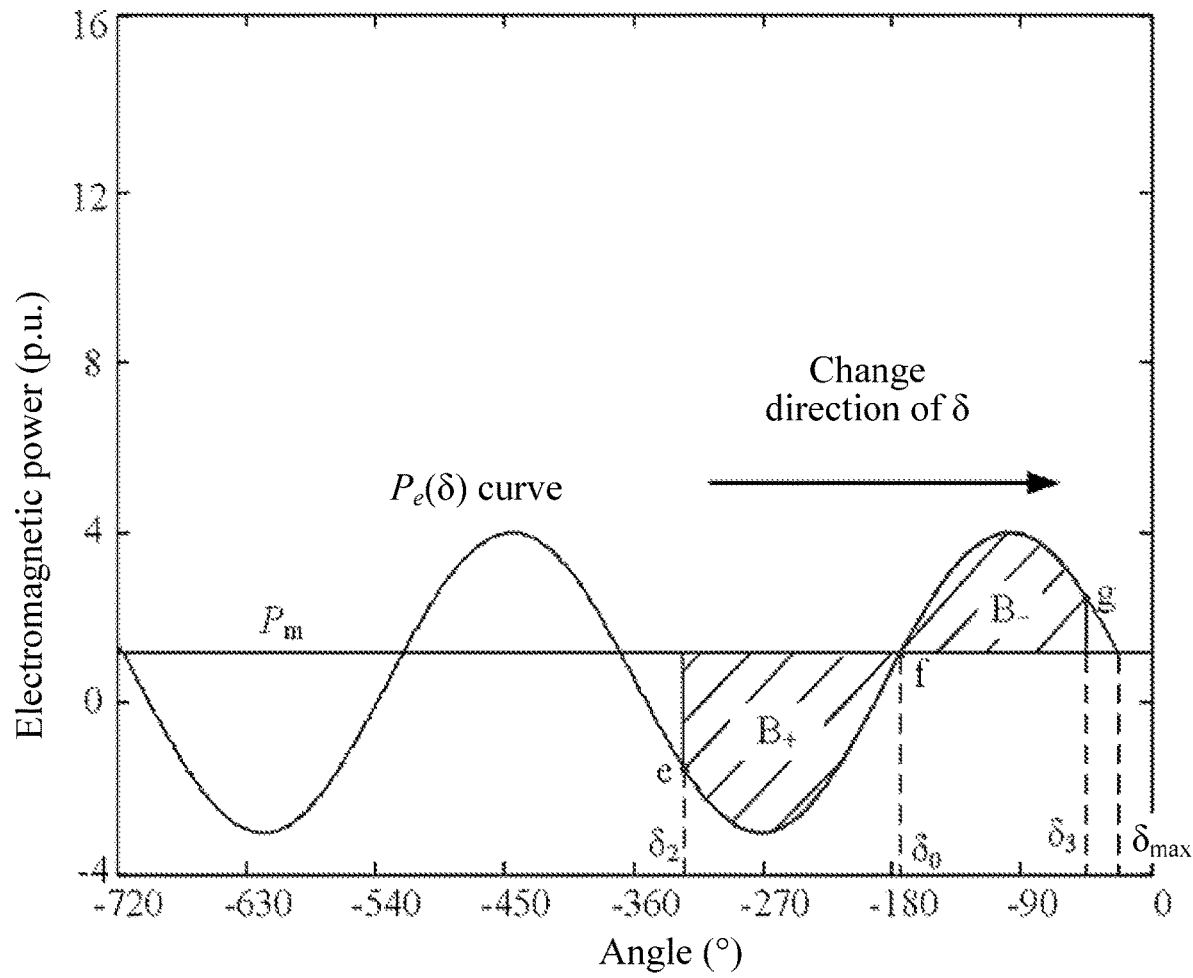
FIG. 2(b) is a diagram of a phase-2 power angle operating state of a half-wavelength transmission system according to an embodiment.

FIG. 2(a) and FIG. 2(b) shows the relationship between the electromagnetic power and the power angle of the generator under a fault condition, where the angle shown in FIG. 2(a) and FIG. 2(b) represents the power angle of the generator. As shown in FIG. 2(a), when a fault occurs in a most severe fault zone of a half-wavelength transmission line, the electromagnetic power is significantly greater than the mechanical power, an operating point of the system moves from point a to point b, the power angle of the generator shows a decreasing trend, and a deceleration area A− is obtained. When the fault is cleared at 61, the operating point of the system moves from point c to point d, with $\Delta\omega<0$ and $P_m-P_e(\delta_0)>0$, an acceleration area A+ is obtained while the power angle continuously decreases, and $\Delta\omega$ is equal to 0 at point e, namely, at the power angle of $\delta_2$. At this moment, the mechanical power of the generator is greater than the electromagnetic power. As shown in FIG. 2(b), the generator obtains an acceleration area B+, and obtains a deceleration area B− after the power angle exceeds the initial power angle $\delta_0$, and the operating point of the system moves from point e to point f and finally reaches point g. If the effect of the damping is not considered, the power angle oscillates between point g and point e. If the effect of the damping is considered, the power angle finally returns to the initial operating point $\delta_0$. Based on the above analysis, it can be found that there are two power angle instability modes near a most severe fault point of the half-wavelength transmission line. First, in operating phase 1, if the obtained acceleration area A+ is less than A− when the power angle of the generator runs to $\delta_{min}$, the generator continuously obtains the deceleration area, and the angular velocity continuously decreases to a shutdown state. If the obtained acceleration area A+ is equal to A− when $\delta_2>\delta_{min}$, the generator starts to accelerate in reverse. If B+=B−, the generator returns to an initial operating state under the effect of the damping, and the system is stable. If B+>B− when a maximum power angle 63 of the generator is equal to $\delta_{max}$, the generator continuously accelerates to an instable state. To sum up, there are two instability modes at a most severe fault point of the half-wavelength transmission system. After the fault, that the power angle of the generator continuously decreases to the shutdown state is defined as the instability mode 1; and that the generator decelerates first and then accelerates to the instable state is defined as the instability mode 2.

S2: Obtain the electromagnetic power and the power angle of the feeding-end generator of the half-wavelength transmission system based on the WAMS and the PMU.

The WAMS and the PMU have been widely used in the field of state monitoring of a power grid. The present disclosure uses, as an input, real-time data of the power grid that is collected by the system and the apparatus.

S3: Construct the phase plane curve between the power angle and the angular velocity of the generator by taking the power angle of the generator as the abscissa and the angular velocity of the generator as the ordinate.

A power angle-angular velocity ($\delta$–$\Delta\omega$) phase plane of the system can be constructed by taking the power angle $\delta$ as an abscissa and the angular velocity $\Delta\omega$ as an ordinate. A transient process of the generator can be expressed as a curve that changes with time on the phase plane, which is referred to as the phase trajectory. Stability of the system can be analyzed based on the phase trajectory. When the three-phase short circuit occurs at the most severe fault point of the half-wavelength transmission line, the electromagnetic power drastically rises instantaneously at the moment of the occurrence of the fault, showing negative unbalanced power, the angular velocity shows a decreasing trend, and the power angle of the generator continuously decreases. If the fault can be cleared in time, a closed phase trajectory appears, and the system is stable. If the fault cannot be cleared in time, the phase trajectory of the generator is divergent and unstable.

S4: Define the convexity-concavity of the phase trajectory based on the change rate of which the slope of the phase trajectory of the phase plane curve between the power angle and the angular velocity of the generator changes with the power angle, and construct the boundaries of the convex region.

The slope of the phase trajectory of the feeding-end generator of the half-wavelength transmission system is deduced as follows:

$$k = \frac{d\Delta\omega}{d\delta} = \frac{\Delta P(\delta)}{M\omega_0 \Delta\omega}$$

In the above formula, $\delta$ represents the power angle of the generator, $\omega_0$ represents the synchronous angular velocity in the initial state; $\Delta\omega$ represents the change value of the angular velocity; M represents an inertia constant, and $\Delta P(\delta)$ represents a change value of the electromagnetic power.

The change rate of which the slope of the phase trajectory changes with the power angle is deduced as follows:

$$v = \frac{dk}{d\delta} = \frac{d^2 \Delta\omega}{d\delta^2}$$

The convexity-concavity of the phase trajectory is defined as: 1) The phase trajectory is located in a concave region when $v\Delta\omega<0$; 2) The phase trajectory is located in the convex region when $v\Delta\omega>0$; 3) The phase trajectory is located at a junction of the concave and convex regions when $v\Delta\omega=0$. The boundaries of the convex region are further deduced as follows:

$$\Delta\omega = \pm\sqrt{\frac{\Delta P(\delta)^2}{-M\omega_0 \Delta P'(\delta)}}$$

In the above formula, ΔP'(δ) represents a first derivative of unbalanced power to the power angle.

Figure 3:
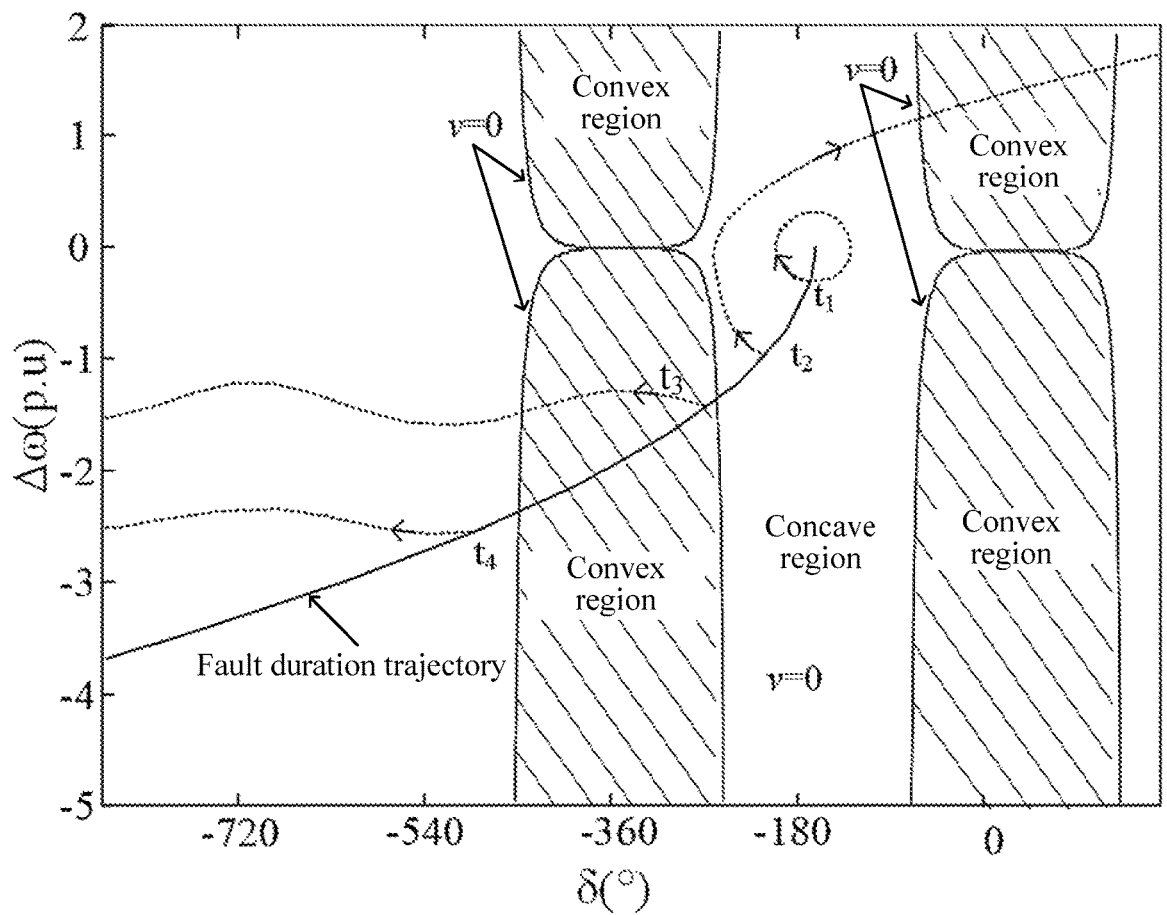
FIG. 3 shows phase trajectories under different fault clearing time in a half-wavelength transmission line region according to an embodiment.

The phase trajectory and convexity-concavity boundaries of the generator that are drawn on the phase plane are shown in FIG. 3. Fast fault clearing can make the inflection point appear on the phase trajectory, such that the closed trajectory in a clockwise direction appears, and the system remains stable. If the fault cannot be cleared within ultimate time, the power angle continuously accelerates or decelerates based on an original operating trend, resulting instability of the system. Although a power angle difference between a feeding end and a receiving end of the half-wavelength transmission line has exceeded 180° in normal operation, it can be found by observing the phase trajectory curve that the instability of the system is not directly related to an absolute value of the power angle difference, but is comprehensively affected by factors such as fault clearing time, a load level and dynamic characteristics of the generator. Therefore, characteristic analysis of the phase trajectory after the fault can be used to determine the transient stability of the half-wavelength transmission system, avoiding a possible misjudgment caused by the determining method based the absolute value of the power angle difference.

S5: Define the instability mode 1 in S1 as that the phase trajectory of the generator moves to the left plane and crosses the left boundary of the convex region, and define the instability mode 2 in S1 as that the phase trajectory of the generator first moves to the left plane, and then moves to the right plane and crosses the right boundary of the convex region.

According to the schematic diagram shown in FIG. 3, a position of an inflection point with v=0 of the phase trajectory is drawn, as shown in the figure. It should be pointed out that an exact power angle expression of the half-wavelength transmission system contains a hyperbolic function, which is difficult to parse, and an obtained inflection point curve is a numerical solution. When the fault cannot be cleared in time, the phase trajectory is caused to enter the shaded convex region. In this case, it is determined that the system is unstable. As shown in the figure, when the fault clearing time is t1, the phase trajectory of the generator is a closed curve, and it is considered that the system is stable; when the fault clearing time is t3, the phase trajectory of the generator moves to the left plane and crosses the left boundary of the convex region, and it is considered that the system is instable, which is defined as the instability mode 1; when the fault clearing time is t2, the phase trajectory of the generator first moves to the left plane, and then moves to the right plane and crosses the right boundary of the convex region, and it is considered as that the system is instable, which is defined as the instability mode 2.

S6: Based on the needs of engineering stability, construct the method for discretizing the determining index, and propose the auxiliary index for representing the direction field of the inflection point.

The above stability determining formula is given based on a model. In order to adapt to response-based stability determining, the determining index needs to be discretized. A discrete determining index is as follows:

$$\tau = v\Delta\omega = \frac{k(i) - k(i-1)}{\delta(i) - \delta(i-2)} \frac{\delta(i) - \delta(i-2)}{t(i) - t(i-2)} = \frac{k(i) - k(i-1)}{t(i) - t(i-2)} > 0$$

$$k(i) = \frac{\Delta\omega(i) - \Delta\omega(i-1)}{\delta(i) - \delta(i-1)}$$

Because an electromagnetic curve of the half-wavelength transmission system is no longer sine relation in an ideal situation, and considering the impact of the excitation regulator and the frequency regulator of the generator and other factors, a direction of a direction field of the phase trajectory after the phase trajectory crosses the inflection point curve is no longer unique, and an equivalent phase trajectory may return to the concave region again after entering the convex region. Therefore, using only a single index may lead to a misjudgment. The auxiliary index r for representing the direction field of the inflection point is proposed. The auxiliary index r is now defined as follows:

$$r = \frac{dv}{dt}\Big|_{t=0} = \frac{d^2 \Delta P(\delta)}{Md\delta^2}$$

A discrete auxiliary engineering determining index is as follows:

$$r(i) = \Delta P'(i) - \Delta P'(i-1) > 0$$

$$\Delta P'(i) = \frac{\Delta P(i) - \Delta P(i-1)}{\delta(i) - \delta(i-1)}$$

In the above formula, ΔP'(i) represents a first derivative of the change value of the electromagnetic power.

S7: Quickly determine the transient power angle stability and the power angle instability mode of the half-wavelength transmission system based on the constructed index system.

Figure 4:
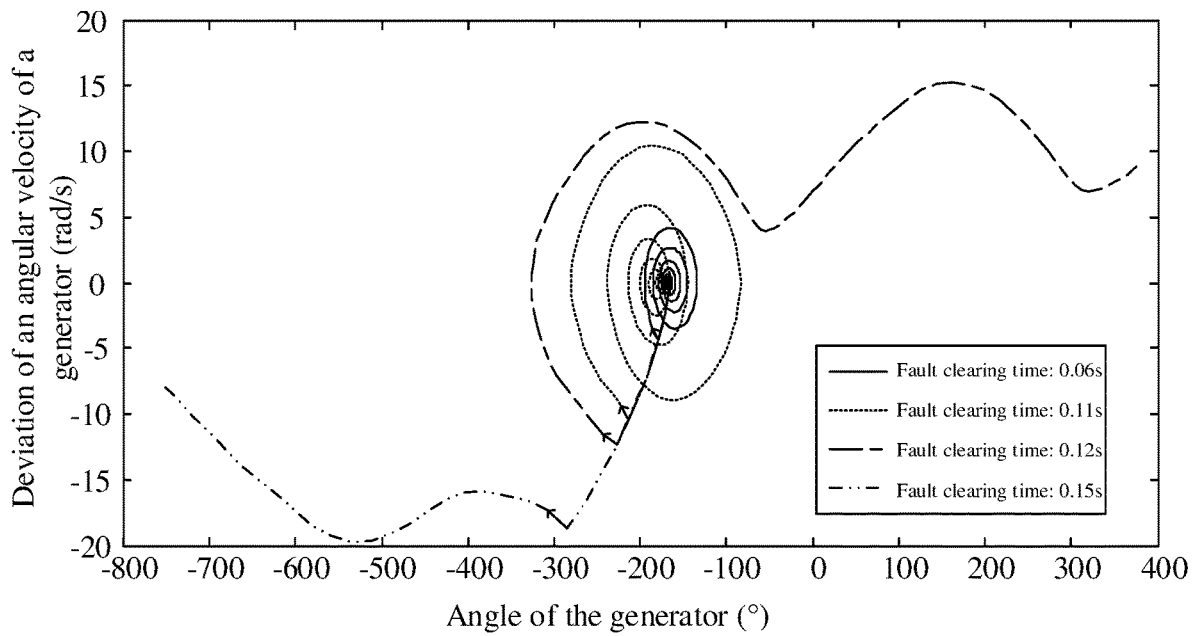
FIG. 4 shows a phase trajectory curve of a feeding-end generator under a test condition according to an embodiment.

Effectiveness of the proposed method is verified by simulating a fault based on actual system parameters. When the fault of the test system is set at 2600 km of the line, transmission power of the line before the fault is 1 p.u, and when the fault clearing time is 0.06 s, 0.11 s, 0.12 s, and 0.15 s, corresponding phase trajectory curves of the generator during the fault are shown in FIG. 4. In FIG. 4, the angle of the generator represents the power angle of the generator. When ultimate fault clearing time is within 0.11 s, the phase trajectory curve converges to the initial state, and the system is stable. When the fault clearing time is greater than 0.12 s, the phase trajectory is divergent. Similar to the above analysis conclusion, there are two different instability modes in a current operating state. As shown by the curve represented by 0.12 s in the figure, the fault clearing time is 0.12 s, and the power angle of the feeding-end generator shows a reverse swing trend, and a positive swing amplitude of a second swing is larger, and the generator accelerates to the unstable state. When the fault clearing time increases to 0.15 s, as shown by the black curve, the generator continuously decelerates to the shutdown state.

Figure 5:
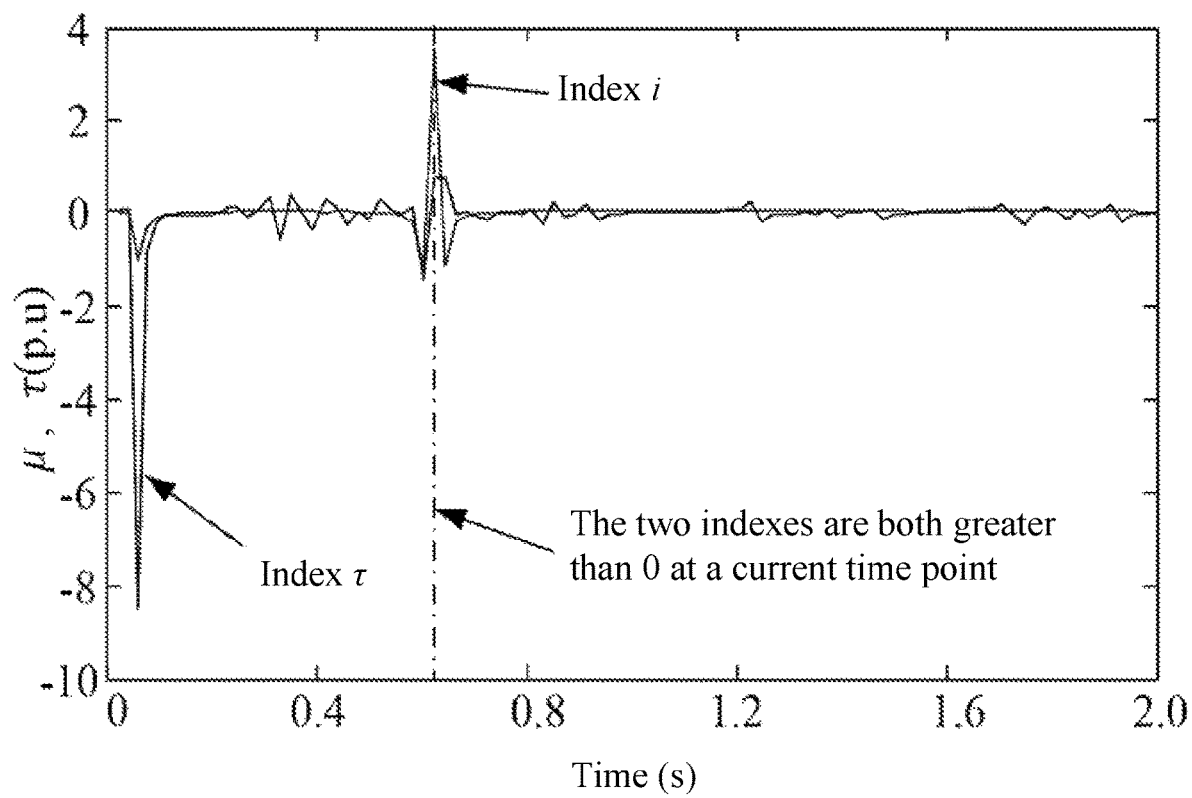
FIG. 5 is a time-domain change diagram of indexes for determining transient stability under a test condition according to an embodiment.

When the fault clearing time shown in FIG. 5 is 0.12 s, the two indexes proposed in the present disclosure are greater than zero at about 0.6 s, which meets a criteria for the instability. When the fault clearing time in FIG. 5 is 0.11 s, the two indexes are not greater than zero at the same time. It can be seen that the method for determining the transient stability based on the convexity-concavity of the phase trajectory has good adaptability under a critical fault condition, and can be used to determine the instability of the half-wavelength transmission system.

Embodiment 2

A system for quickly determining transient stability of a half-wavelength transmission system includes:
- a data obtaining unit configured to obtain power and a power angle of a feeding-end generator of a half-wavelength transmission system based on a WAMS and a PMU; and
- a mode determining unit configured to determine transient power angle stability and a power angle instability mode of the half-wavelength transmission system by using a constructed index system, where
- two power angle instability modes are specifically constructed for the half-wavelength transmission system based on an equal area method: an instability mode 1 and an instability mode 2.

In this embodiment of the present disclosure, the data obtaining unit and the mode determining unit each may be one or more processors, controllers or chips that each has a communication interface, can realize a communication protocol, and may further include a memory, a related interface and system transmission bus, and the like if necessary. The processor, controller or chip executes program-related code to realize a corresponding function. In an alternative solution, the data obtaining unit and the mode determining unit share an integrated chip or share devices such as a processor, a controller and a memory. The shared processor, controller or memory executes program-related code to implement a corresponding function.

Embodiment 3

A computer-readable storage medium stores a plurality of instructions, where the instructions are suitable for being loaded by a processor of a terminal device to execute the method for quickly determining transient stability of a half-wavelength transmission system in Embodiment 1.

Embodiment 4

A terminal device includes a processor and a computer-readable storage medium, where the processor is configured to implement various instructions; and the computer-readable storage medium is configured to store a plurality of instructions, and the instructions are suitable for being loaded by the processor to execute the method for quickly determining transient stability of a half-wavelength transmission system in Embodiment 1.

Those skilled in the art should understand that the embodiments of the present disclosure may be provided as a method, a system, or a computer program product. Therefore, the present disclosure may use a form of hardware only embodiments, software only embodiments, or embodiments with a combination of software and hardware. Moreover, the present disclosure may be in a form of a computer program product that is implemented on one or more computer-usable storage media (including but not limited to a magnetic disk memory, a CD-ROM, an optical memory, and the like) that include computer-usable program code.

The present disclosure is described with reference to the flowcharts and/or block diagrams of the method, the device (system), and the computer program product according to the embodiments of the present disclosure. It should be understood that computer program instructions may be used to implement each process and/or each block in the flowcharts and/or the block diagrams and a combination of a process and/or a block in the flowcharts and/or the block diagrams. These computer program instructions may be provided for a general-purpose computer, a dedicated computer, an embedded processor, or a processor of another programmable data processing device to generate a machine, such that the instructions executed by a computer or a processor of another programmable data processing device generate an apparatus for implementing a specific function in one or more processes in the flowcharts and/or in one or more blocks in the block diagrams.

These computer program instructions may be stored in a computer-readable memory that can instruct a computer or another programmable data processing device to work in a specific manner, such that the instructions stored in the computer-readable memory generate an artifact that includes an instruction apparatus. The instruction apparatus implements a specific function in one or more processes in the flowcharts and/or in one or more blocks in the block diagrams.

These computer program instructions may be loaded onto a computer or another programmable data processing device, such that a series of operations and steps are performed on the computer or the another programmable device, thereby generating computer-implemented processing. Therefore, the instructions executed on the computer or the another programmable device provide steps for implementing a specific function in one or more processes in the flowcharts and/or in one or more blocks in the block diagrams.

The foregoing descriptions are merely preferred embodiments of the present disclosure, and are not intended to limit the present disclosure. For a person skilled in the art, various modifications and changes may be made to the present disclosure. Any modifications, equivalents, improvements, etc. made within the spirit and principle of the present disclosure shall all fall within the protection scope of the present disclosure.

The above describes the specific implementations of the present disclosure with reference to the accompanying drawings, but is not intended to limit the protection scope of the present disclosure. Those skilled in the art should understand that any modifications or variations made by those skilled in the art based on the technical solutions of the present disclosure without creative efforts still fall within the protection scope of the present disclosure.

The invention claimed is:

1. A method for quickly determining transient stability of a half-wavelength transmission system, comprising:
   - obtaining power and a power angle of a feeding-end generator of a half-wavelength transmission system; and
   - determining transient power angle stability and a power angle instability mode of the half-wavelength transmission system by using a constructed index system, wherein
   - two power angle instability modes, that is, an instability mode 1 and an instability mode 2, are specifically constructed for the half-wavelength transmission system based on an equal area method;
   - wherein in the instability mode 1, the generator continuously decelerates and loses stability; and in the instability mode 2, the generator decelerates first, and then continuously accelerates and loses the stability;
   - wherein the constructed index system comprises a phase plane curve between the power angle and an angular velocity of the generator, which takes the power angle of the generator as an abscissa and the angular velocity of the generator as an ordinate.

2. The method for quickly determining transient stability of a half-wavelength transmission system according to claim 1, wherein the constructed index system further comprises boundaries of a convex region, and the boundaries of the convex region are constructed based on convexity-concavity, of a phase trajectory, defined by a change rate of which a slope of the phase trajectory of the phase plane curve between the power angle and the angular velocity of the generator changes with the power angle.

3. The method for quickly determining transient stability of a half-wavelength transmission system according to claim 2, wherein the instability mode 1 is defined as that the phase trajectory of the generator moves to a left plane and crosses a left boundary of the convex region.

4. The method for quickly determining transient stability of a half-wavelength transmission system according to claim 3, wherein the instability mode 2 is defined as that the phase trajectory of the generator first moves to the left plane, and then moves to a right plane and crosses a right boundary of the convex region.

5. The method for quickly determining transient stability of a half-wavelength transmission system according to claim 4, wherein the constructed index system further comprises an auxiliary index for representing a direction field of an inflection point; and the determining transient power angle stability and a power angle instability mode of the half-wavelength transmission system by using a constructed index system comprises:
constructing a method for discretizing a determining index, to meet needs of engineering stability; and
discretizing the constructed index system by using the constructed method for discretizing the determining index, to determine the transient power angle stability and the power angle instability mode of the half-wavelength transmission system based on a discretized index system.

6. A system for quickly determining transient stability of a half-wavelength transmission system, comprising:
a data obtaining unit configured to obtain power and a power angle of a feeding-end generator of a half-wavelength transmission system; and
a mode determining unit configured to determine transient power angle stability and a power angle instability mode of the half-wavelength transmission system by using a constructed index system, wherein
two power angle instability modes, that is, an instability mode 1 and an instability mode 2, are specifically constructed for the half-wavelength transmission system based on an equal area method;
wherein in the instability mode 1, the generator continuously decelerates and loses stability; and in the instability mode 2, the generator decelerates first, and then continuously accelerates and loses the stability;
wherein the constructed index system comprises a phase plane curve between the power angle and an angular velocity of the generator, which takes the power angle of the generator as an abscissa and the angular velocity of the generator as an ordinate.

7. A computer-readable storage medium, storing a plurality of instructions, wherein the instructions are suitable for being loaded by a processor of a terminal device to execute the method for quickly determining transient stability of a half-wavelength transmission system according to claim 1.

8. A terminal device, comprising a processor and a computer-readable storage medium, wherein the processor is configured to implement various instructions; and the computer-readable storage medium is configured to store a plurality of instructions, and the instructions are suitable for being loaded by the processor to execute the method for quickly determining transient stability of a half-wavelength transmission system according to claim 1.

9. A computer-readable storage medium, storing a plurality of instructions, wherein the instructions are suitable for being loaded by a processor of a terminal device to execute the method for quickly determining transient stability of a half-wavelength transmission system according to claim 2.

10. A computer-readable storage medium, storing a plurality of instructions, wherein the instructions are suitable for being loaded by a processor of a terminal device to execute the method for quickly determining transient stability of a half-wavelength transmission system according to claim 3.

11. A computer-readable storage medium, storing a plurality of instructions, wherein the instructions are suitable for being loaded by a processor of a terminal device to execute the method for quickly determining transient stability of a half-wavelength transmission system according to claim 4.

12. A terminal device, comprising a processor and a computer-readable storage medium, wherein the processor is configured to implement various instructions; and the computer-readable storage medium is configured to store a plurality of instructions, and the instructions are suitable for being loaded by the processor to execute the method for quickly determining transient stability of a half-wavelength transmission system according to claim 2.

13. A terminal device, comprising a processor and a computer-readable storage medium, wherein the processor is configured to implement various instructions; and the computer-readable storage medium is configured to store a plurality of instructions, and the instructions are suitable for being loaded by the processor to execute the method for quickly determining transient stability of a half-wavelength transmission system according to claim 3.

14. A terminal device, comprising a processor and a computer-readable storage medium, wherein the processor is configured to implement various instructions; and the computer-readable storage medium is configured to store a plurality of instructions, and the instructions are suitable for being loaded by the processor to execute the method for quickly determining transient stability of a half-wavelength transmission system according to claim 4.

* * * * *